United States Patent [19]

Lu

[11] 4,036,167
[45] July 19, 1977

[54] APPARATUS FOR MONITORING VACUUM DEPOSITION PROCESSES

[75] Inventor: Chih-shun Lu, Cupertino, Calif.

[73] Assignee: Inficon Leybold-Heraeus Inc., East Syracuse, N.Y.

[21] Appl. No.: 653,936

[22] Filed: Jan. 30, 1976

[51] Int. Cl.² .................................... C23C 13/08
[52] U.S. Cl. .................................... 118/7; 118/9; 118/49.1; 427/10; 427/248 R
[58] Field of Search ............. 118/7, 9, 49.1, 49.5; 427/10, 294, 296, 248 R

[56] References Cited

U.S. PATENT DOCUMENTS

| 3,168,418 | 2/1965 | Payne, Jr. | 118/49.1 X |
| 3,586,854 | 6/1971 | Zega | 118/49.1 X |
| 3,612,859 | 10/1971 | Schumacher | 118/49.1 X |
| 3,734,620 | 5/1973 | Cade | 118/7 X |

Primary Examiner—Mervin Stein
Attorney, Agent, or Firm—Robert W. Fiddler

[57] ABSTRACT

Apparatus is disclosed for utilizing a low energy electron beam to permit monitoring the rate of deposition and composition of the evaporant particles in a vacuum deposition system. This is accomplished by passing a sample of the evaporant employed in the vacuum deposition process through an enclosure defining a flow path for the evaporant sample which crosses the path of a relatively low energy electron beam which is sufficient to excite the electrons of the atoms constituting the vaporized particles in the deposition chamber. The outer-shell electrons of the atoms constituting the evaporant, after excitation, drop back to a lower energy state in the course of which photons are released which are characteristic of given materials. The enclosure is formed with an optical opening receiving the photons in a path orthogonal with respect to the excitation beam and evaporant sample path, and a photodetector is optically coupled to the opening for sensing the emitted photons. A filter or monochromator is used to select a specific emission line. The resulting electrical signal produced by the photodetector is employed either to provide a readout of the signal detected and/or to actuate control circuitry regulating the operation of the vapor deposition equipment.

7 Claims, 3 Drawing Figures

APPARATUS FOR MONITORING VACUUM DEPOSITION PROCESSES

BACKGROUND OF THE INVENTION

This invention relates to the art of vapor deposition processes, and more particularly to an improved apparatus for sensing and monitoring the deposition rate and composition of the vaporized particles in the vacuum chamber.

A variety of deposition rate monitors have previously been evolved. However, these have proven generally inadequate, particularly when applied in heavy duty production systems.

Thus, quartz crystal detectors have been employed with a quartz crystal arranged in the vacuum deposition chamber, with a sensing face of the crystal on which the particles in the vapor in the system condense. The natural frequency of oscillation of the quartz crystal is effected by the condensation of these particles on the crystal, and the change in oscillation frequency is indicative of the mass of the condensed material. Such quartz detectors are, however, subject to a limited useful life as a result of the accumulated coating of the crystal by the evaporant in the monitored deposition chamber.

Other monitoring techniques have been developed based on ionization of the evaporant particles by electron bombardment in the deposition chamber. The magnitude of the resulting ion current is a measure of the deposition rate. This method requires very sensitive measurement of weak ion current in the deposition chambers and thus is highly susceptible to electrical noises. It is also incapable of distinguishing different materials.

Additionally, in vacuum deposition systems employing electron beam gun heated evaporation sources, monitoring techniques have been evolved relying on observing the intensity of emitted light in the ionized vapor cloud directly above the evaporation source by the same electron beam gun which produces the evaporant vapor. Due to the rapidly fluctuating vapor density near the evaporation sources, the uncontrollable state of ionization, and scattered light from many possible sources, variations in light intensity are found to produce inaccurate readings.

Others have attempted to bombard particles in the deposition chamber to cause emission of X-rays, which are characteristic of the particular particles. The voltage required to produce emission of these X-rays, and the shielding necessary to protect the users of the equipment are such as to make such techniques commercially unfeasible.

BRIEF DESCRIPTION OF THE INVENTION

It is with the above considerations in mind that the present monitoring and detection apparatus has been evolved permitting use of relatively low energy electron sources requiring no shielding to obtain a relatively accurate continuous analysis of the nature of the evaporant in a vacuum deposition process employed for continuous heavy duty production.

It is accordingly among the primary objects of this invention to provide apparatus for monitoring the rate of deposition and composition of the evaporant in a vacuum deposition chamber, with the deposition rate subject to measurement over a large range. A further object of the invention is to provide monitoring apparatus for sensing and measuring deposition rate and evaporant composition in a vacuum deposition chamber with the apparatus subject to minimal interference with and by the deposition process taking place in the chamber.

A further object is to provide apparatus for monitoring deposition rate and evaporant composition in a vacuum deposition chamber on a continuous basis.

An additional object of the invention is to provide a monitoring apparatus for use in vacuum deposition processes for measuring the deposition rates and composition of dielectrics as well as metals.

An additional object of the invention is to provide a deposition monitor for vacuum deposition processes in which the evaporant source is produced either by electron beam gun heating, induction heating, or resistance heating.

A further object of the invention is to provide a deposition monitoring apparatus for use in vacuum deposition processes in which the output signal is relatively linear with respect to deposition rates and not subject to interference from electrical discharge, charged particles, and variations in background gas pressure.

These and other objects of the invention which will become hereafter apparent are achieved by confining a sample of the evaporant vapor employed in the vacuum deposition process. This is preferably done by passing a portion of the evaporant in the vacuum chamber through a relatively small enclosure. The atoms of the particles in the evaporant sample passed through the enclosure are subjected to an excitation charge sufficient to raise the energy level of at least some of the electrons of the atoms. This is done by directing a relatively low energy electron beam across the flow path of the evaporant sample passing through the enclosure. An optical opening is formed in the enclosure receiving light on an axis orthogonal to the axis of flow of the evaporant sample through the enclosure, and the axis of the excitation beam. The photons released as the excited electrons drop back to their lower energy states are then detected, preferably by means of photodetection equipment such as a photodetector optionally coupled to the enclosure opening, with the detector converting the light intensity into an electrical signal. The electrical signal may then be employed either to energize a meter or the like indicator providing a readout indicative of the characteristic light emission of the evaporant, or may be employed in a feed back loop to control the operation of the deposition chamber by controlling the power to energize the evaporant source.

The specific details of a preferred embodiment of the invention, and the best mode contemplated by the inventor of the manner and process of making and using the invention will be described in clear, concise, and exact terms in conjunction with the accompanying drawings, wherein.

DESCRIPTION OF PREFERRED EMBODIMENT

Figure 1:
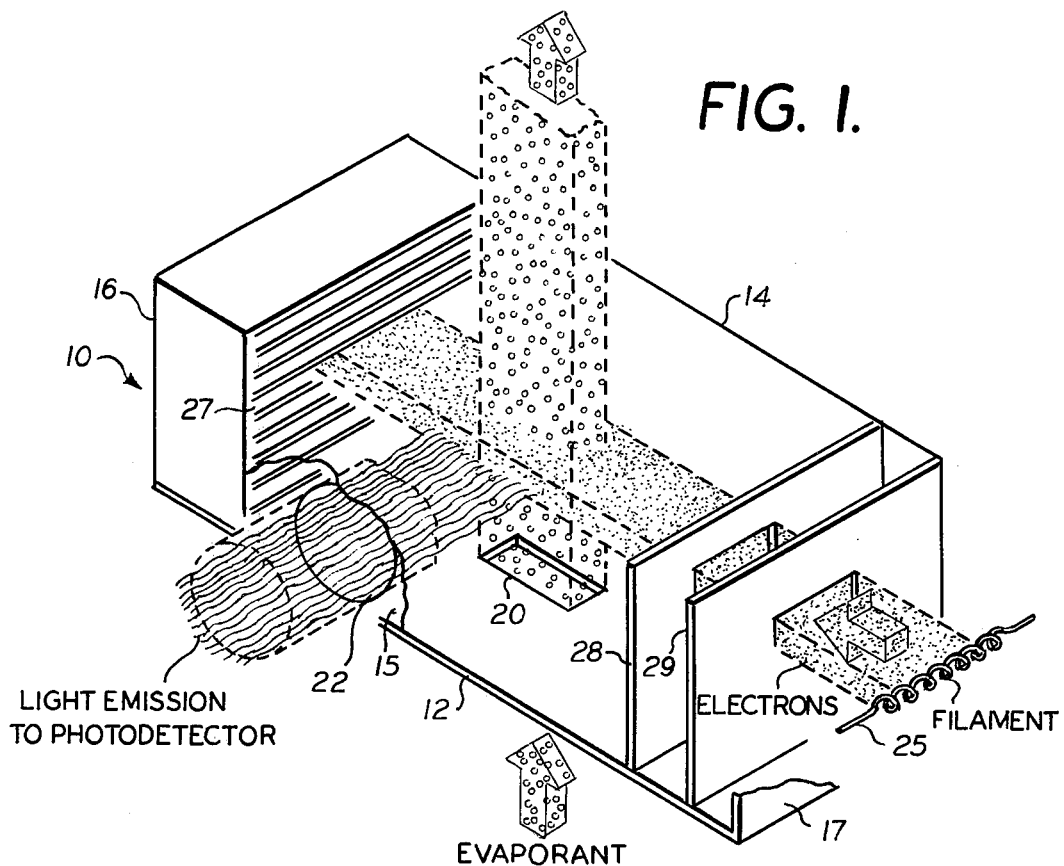
FIG. 1 is a schematic perspective view with the top wall removed and one end wall and side wall broken away of a sensor embodying the inventive concept for use in practicing the invention.

Referring now more particularly to the drawings, where like numerals in the various FIGS. will be employed to designate like parts, the sensor 10 as schematically shown in FIG. 1 is of a rectangular box-like configuration having a bottom wall 12, a similar top wall (removed for purposes of illustration), two opposed side walls 14 and 15 (wall 15 being broken away) and end walls 16 and 17 (end wall 17 being broken away at the right side of FIG. 1). The bottom wall 12, as well as the top wall (not shown) are formed with a vapor sample passage 20 through which a confined sample of the evaporant to be monitored may be passed in a defined flow path.

Side wall 15 is formed with an opening 22 providing a passage for light along a path perpendicular to the path of the evaporant sample passing through vapor sample passage 20.

An excitation electron beam source is provided by filament 25, shown to the right in FIG. 1, which is energized to provide relatively low energy electrons generally of an order of magnitude or less than 200 ev which is sufficient to effect excitation of the outer shell electrons of the atoms normally constituting the evaporant subjected to monitoring. An anode 27 is provided at the end of the sensor housing adjacent end wall 16 on the side of the evaporant sample opening 20 remote from the filament, so that the excitation electrons generated by the filament pass across the evaporant beam passing through the sensor, as schematically shown in FIG. 1. Positively charged focusing electrodes 28 and 29 are positioned in the path of the excitation electron beam to form the excitation beam with a well defined energy and a relatively well defined shape, preferably of rectangular cross-section insuring intersection of the excitation electron beam produced by the filament 25 with the confined path of the evaporant sample passing through evaporant sample opening 20 through the sensor.

Figure 2:
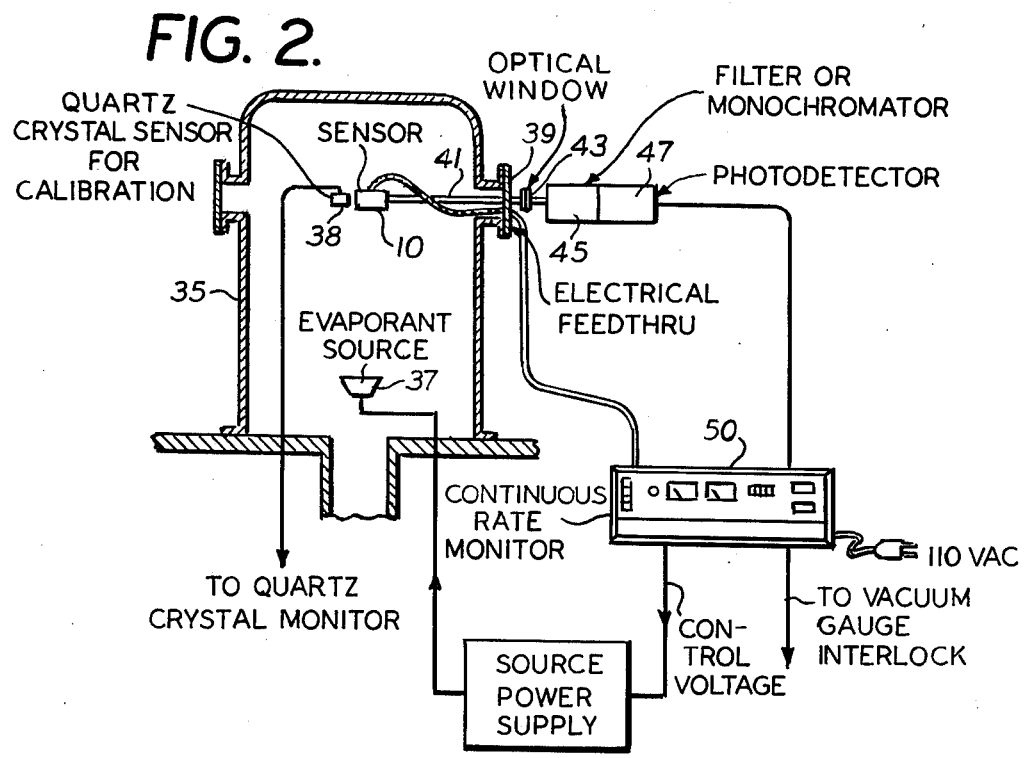
FIG. 2 is a schematic view of a proposed arrangement of the sensor of FIG. 1 with respect to a vacuum deposition system.

The sensor 10 is illustratively shown in FIG. 2 arranged in a vacuum deposition chamber 35. As shwon in FIG. 2, the vacuum deposition chamber is shown with an evaporant source 37, which is schematically shown as electrically heated to produce the desired evaporant. As illustratively shown, a quartz crystal sensor 38 may be employed for calibration of the sensor 10. The sensor 10 is arranged above the evaporant source 37 at a spaced distanced therefrom to insure the passage through the sensor of a typical sample of the evaporant in the deposition chamber 35 not subject to the rapidly fluctuating vapor density adjacent the source 37. An electrical and optical feedthru 39 in a wall of the deposition chamber 35 is provided through which the electrical connections to the sensor electrodes and filaments may be made, and through which a light transmitting conduit 41 in the form of a rigid light pipe or a flexible fiber optic cable may be extended.

In the illustrated preferred embodiment, this light transmitting conduit 41 leads to an optical window 43 and then through a filter 45 (or monochromator) serving to pass only those wavelengths of the emitted light indicative of the component of the evaporant which it is desired to monitor. The filtered light of wavelength of interest is then fed to detector 47.

The signal from the photodetector 47 may, as will be understood by those skilled in the art, be fed to a variety of measuring and control equipment 50, which may take a variety of forms.

Figure 3:
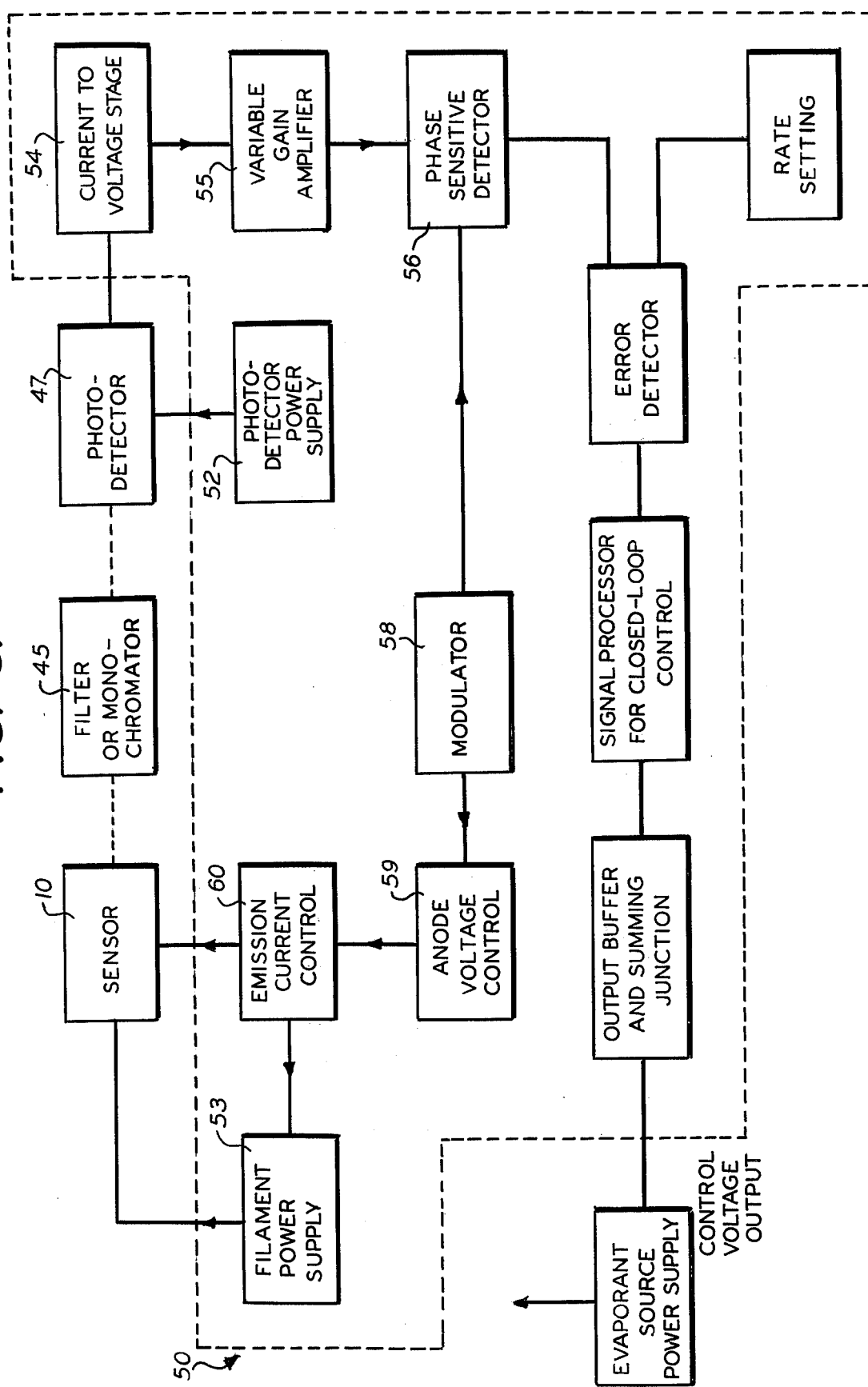
FIG. 3 is a block diagram of a monitoring and controlling system employing the sensor of FIG. 1.

One suggested circuit arrangement for control equipment 50 is shown by block diagram in FIG. 3. The measuring and control equipment 50, as illustratively shown, may include a photodetector power supply circuit 52 and the filament power supply 53 for energizing the excitation filament 25 of the sensor. The signal from the photodetector 47 is fed into a current to voltage state circuit 54, the output voltage of which is fed through a variable gain amplifier 55 to a phase sensitive detector circuit 56. A modulator 58 such as an oscillator or the like is provided for generating a modulating frequency which is fed to the phase sensitive detector 56, and through an anode voltage control circuit 59 to an emission control circuit 60, coupled to filament power supply 53 and to sensor 10. The modulator frequency is selected in a range such that the reading of the equipment will not be effected by ambient radiation. Frequencies of an order of magnitude of about 200 Hz are found eminently suitable. The modulated output signal from the phase sensitive detector is fed to an error detector circuit with an output to provide a signal for actuating a rate setting circuit, and is additionally directed to summing circuitry providing a corrective signal indicative of the deviation of the monitored deposition rate from the desired deposition rate, with the signal employed to control the energization of the evaporant source power supply as indicated in FIG. 3.

OPERATION

A sensor 10 made in accordance with the teachings of the invention as above described is positioned in the vapor deposition chamber 35, as best seen in FIG. 2, with the evaporant sample opening 20 preferably oriented at a point at the upper half of the chamber in a path directly above the evaporant source 37. Appropriate electrical and optical connections are effected through the deposition chamber feedthru 39, with the electrical connections providing a negative charge on filament 25 sufficient to generate an electron beam of relatively low energy sufficient to effect excitation of the outer shell electrons of the atoms of the evaporant in the vacuum chamber 35. The housing of the sensor, anode 27, and focusing electrodes 28 and 29, are preferably coupled into the circuit with filament 25. In the preferred embodiment the filament 25 is maintained at a negative potential and the anode 27 and focusing electrodes 28 and 29, and the housing are all maintained at the same positive potential.

The electron beam produced by the potential difference between filament 25 and anode 27 as disclosed is preferably electronically chopped by modulator 58 at about 200 Hz so that any signals produced by ambient radiation can be eliminated with conventional phase sensitive detection techniques. The relatively low energy electron beam is sufficient to excite the outer shell electrons of the atoms in the evaporant vapor within the deposition chamber 35. As a result of this excitation, one or more outer shell electrons of the evaporant atoms are raised to energy levels higher than normal ground state. These excited electrons in falling back to lower energy states emit photons of specific wavelengths characteristics of the excited atomic or molecular species.

If the emission is analyzed by a scanning monochromater, one obtains a characteristic spectrum of the evaporant. Thus, monitoring this characteristic spectrum of the emitted light from the sensor serves to provide a means of identifying the material. For any particular emission line, the intensity versus electron energy curve is known as the optical excitation function of the particular transition. In order to excite the atoms, the electron energy must be greater than the threshold value. The generation of usable spectral lines is accomplished by selecting an appropriate electron energy above the threshold value. With wavelength and electron energy both fixed, the intensity of emitted photons is found to be proportional to the vapor density of the sample evaporant passing through the sensor.

By confining the flow path of the sample evaporant through the enclosure provided by the sensor, and by forming the photon passage in the sensor opening out of the path of the sampled evaporant clear spectral lines of sufficient intensity have been found to be obtainable utilizing a relatively low energy excitation electron beam.

The above disclosure has been given by way of illustration and elucidation, and not by way of limitation, and it is desired to protect all embodiments of the herein disclosed inventive concept within the scope of the appended claims.

What is claimed is:

1. In a vapor deposition system having a vapor deposition chamber in which a substrate to be coated is received, and an evaporant source in the chamber providing vaporized particles for deposit on the substrate, a sensor for determining the deposition rate and composition of the vapor atmosphere in the chamber, said sensor comprising:
    an enclosure arranged in the path of the evaporant particles to receive a sample of the vaporized particles in the deposition chamber;
    an electron beam source providing relatively low energy electrons sufficient to excite the outer shell electrons of the atoms of the sample of the vaporized particles in said enclosure;
    an optical opening in said enclosure receiving the light emitted by the photons produced as the electrons of the excited atoms drop back to lower energy states, said opening receiving light in a path perpendicular to the path of the excitation electron beam; and
    a photodetector optically coupled to said opening.

2. In a vapor deposition chamber, a sensor as in claim 1 in which said enclosure is of a rectangular box-like configuration comprising top, bottom, two side and two end walls, said top and bottom walls having aligned openings therein through which a sample portion of the evaporant particles in the deposition chamber may pass, said excitation electron beam oriented to move along a flow path between said end walls at right angles to the flow of the sample portion of evaporant through said enclosure; and said optical opening arranged in one of said side walls, receiving light at right angles to said evaporant flow path, and said excitation electron beam.

3. In a vapor deposition chamber, a sensor as in claim 1 in which said excitation electron beam source is electrically coupled to a power supply and a modulator controlling said power supply to provide a chopped electron beam.

4. In a vapor deposition chamber, a sensor as in claim 2 in which said electron beam source comprises as electrical filament adjacent one end wall of said enclosure; and an anode adjacent the other end wall of said enclosure, said filament and anode arranged on opposite ends of the aligned openings in said top and bottom walls.

5. In a vapor deposition chamber, a sensor as in claim 2 in which said filament and anode are arranged in a circuit comprising a power supply independent of the evaporant source; and a modulator controlling the frequency of said power supply.

6. In a vapor deposition chamber, a sensor as in claim 5 in which said photodetector is in an electrical circuit comprising a phase sensitive detector electrically coupled to said modulator.

7. In a vapor deposition chamber, a sensor as in claim 5 in which said photodetector is electrically coupled to said evaporant source to control the rate of evaporant supplied to said chamber.

* * * * *